US006886246B2

(12) United States Patent
Chung (10) Patent No.: US 6,886,246 B2
(45) Date of Patent: May 3, 2005

(54) METHOD FOR MAKING AN ARTICLE HAVING AN EMBEDDED ELECTRONIC DEVICE

(75) Inventor: Kevin Kwong-Tai Chung, Princeton, NJ (US)

(73) Assignee: Amerasia International Technology, Inc., Princeton Junction, NJ (US)

( * ) Notice: Subject to any disclaimer, the term of this patent is extended or adjusted under 35 U.S.C. 154(b) by 221 days.

(21) Appl. No.: 10/140,245

(22) Filed: May 7, 2002

(65) Prior Publication Data

US 2002/0124392 A1 Sep. 12, 2002

Related U.S. Application Data (62) Division of application No. 09/412,058, filed on Oct. 4, 1999, now Pat. No. 6,404,643.
(60) Provisional application No. 60/104,337, filed on Oct. 15, 1998, provisional application No. 60/129,497, filed on Apr. 15, 1999, provisional application No. 60/131,377, filed on Apr. 28, 1999, and provisional application No. 60/134,656, filed on May 18, 1999.

(51) Int. Cl.$^7$ ............................ H05K 3/30; H01K 23/02
(52) U.S. Cl. .............................. 29/832; 29/854; 29/840; 29/843; 29/841; 257/679
(58) Field of Search ................................ 361/736, 737, 361/760, 765, 777, 783, 784, 793; 257/679, 683; 174/52.2, 52.3; 29/832, 854, 840, 843, 841, 855; 264/272.11; 156/305

(56) References Cited

U.S. PATENT DOCUMENTS

| | | | |
|---|---|---|---|
| 3,915,780 A | | 10/1975 | Broussard, Jr. et al. |
| 4,417,413 A | | 11/1983 | Hoppe et al. |
| 4,483,067 A | | 11/1984 | Parmentier |
| 4,719,140 A | | 1/1988 | Hara et al. |
| 4,725,924 A | * | 2/1988 | Juan ........................... 361/751 |
| 4,890,383 A | * | 1/1990 | Lumbard et al. ............. 438/27 |
| 5,026,452 A | | 6/1991 | Kodai |
| 5,241,133 A | * | 8/1993 | Mullen et al. ............. 174/52.4 |
| 5,250,341 A | | 10/1993 | Kobayashi et al. |
| 5,371,327 A | | 12/1994 | Fujinami et al. |
| 5,430,441 A | | 7/1995 | Bickley et al. |
| 5,463,404 A | | 10/1995 | Wall |
| 5,519,201 A | | 5/1996 | Templeton, Jr. et al. |
| 5,535,101 A | * | 7/1996 | Miles et al. ................. 361/808 |
| 5,543,008 A | | 8/1996 | Hidber et al. |
| 5,574,470 A | | 11/1996 | de Vall |
| 5,598,032 A | | 1/1997 | Fidalgo |
| 5,690,773 A | | 11/1997 | Fidalgo et al. |
| 5,734,201 A | * | 3/1998 | Djennas et al. ............. 257/783 |
| 5,741,729 A | | 4/1998 | Selna |
| 5,751,256 A | | 5/1998 | McDonough et al. |
| 5,767,503 A | | 6/1998 | Gloton |
| 5,847,931 A | | 12/1998 | Gaumet et al. |

(Continued)

OTHER PUBLICATIONS

Dr. Elke Zakel, "Smart Cards—An Overview", IEEE,— Second Workshop On Smart Card Technologies And Applications, Berlin, Nov. 16–18, 1998.

(Continued)

Primary Examiner—A. Dexter Tugbang
Assistant Examiner—Tai Nguyen
(74) Attorney, Agent, or Firm—Dann, Dorfman, Herrell & Skillman, P.C.

(57) ABSTRACT

A method for making an article having an electronic device embedded therein comprises providing a substrate having first and second opposing broad planar surfaces; mounting an electronic device on the first broad planar surface of the substrate; and applying a layer of melt-flowable adhesive of substantially uniform thickness on the first broad planar surface of the substrate to cover the electronic device. The article produced thereby has the electronic device encapsulated by the layer of melt-flowable adhesive.

23 Claims, 7 Drawing Sheets

U.S. PATENT DOCUMENTS

| | | | |
|---|---|---|---|
| 5,880,934 A | | 3/1999 | Haghiri-Tehrani |
| 5,892,661 A | | 4/1999 | Stafford et al. |
| 5,899,705 A | * | 5/1999 | Akram ....................... 438/107 |
| 5,909,050 A | | 6/1999 | Furey et al. |
| 5,975,420 A | | 11/1999 | Gogami et al. |
| 5,994,166 A | * | 11/1999 | Akram et al. ............... 438/108 |
| 6,150,193 A | | 11/2000 | Glenn |
| 6,248,199 B1 | | 6/2001 | Smulson |

OTHER PUBLICATIONS

Jorge Vierira da Silva, Contact Less Smart Cards: European applications, co–operative developments and industrial supply environment:, IEEE Second Workshop on Smart Card Technologies And Applications, Berlin, Nov. 16–18, 1998; 18 Pages.

Peter Stampka, Second Generation Contactless Cards, IEEE Second Workshop on Smart Card Technologies And Applications, Berlin, Nov. 16–18, 1998; 8 pages.

E. Zakel, "Advanced Packaging For Smart Cards", IEEE Second Workshop on Smart Card Technologies And Applications, Berlin, Nov. 16–18, 1998,4 Pages.

Dymax Europe Gmbh, "UV Curing Resins For Smart Cards Innovations For Smart Cards", IEEE Second Workshop on Smart Card Technologies And Applications, Berlin, Nov. 16–18, 1998, 4 Pages.

K. Haberger et al, "Comparison of Different Methods to Make Extremely Thin IC's", IEEE Second Workshop on Smart Card Technologies And Applications, Berlin, Nov. 16–18, 1998, 6 Pages.

Reinhard Jurisch, "Coil on Chip Technology for Closed Coupling Contactless Chip Cards", MICROSENSYS, IEEE Second Workshop on Smart Card Technologies and Applications, 1998, 5 Pages.

Kevin Chung, Ph.D., "Smart Card Die–Attach And Module Lamination Alternatives", IEEE Second Workshop on Smart Card Technologies And Applications, Berlin, Nov. 16–18, 1998, 9 Pages.

"Dupont Photopolymer & Electronic Materials", IEEE Second Workshop on Smart Card Technologies And Applications, Berlin, Nov. 16–18, 1998, 17 pages.

Gunter Schiebel, "Low Cost Smart Card/RFID Assembly Using Flip Chip Shooters", Siemens AG, IEEE Second Workshop on Smart Card Technologies And Applications, Berlin, Nov. 16–18, 1998, 12 Pages.

International Search Report, Appln. No.: PCT/US99/23850, Dated Jan. 25, 2000, 2 Pages.

* cited by examiner

METHOD FOR MAKING AN ARTICLE HAVING AN EMBEDDED ELECTRONIC DEVICE

This Application is a division of U.S. patent application Ser. No. 09/412,058 filed Oct. 4, 1999 now U.S. Pat. No. 6,404,643 which claims the benefit of U.S. Provisional Application Ser. No. 60/104,337 filed Oct. 15, 1998, of U.S. Provisional Application Ser. No. 60/129,497 filed Apr. 15, 1999, of U.S. Provisional Application Ser. No. 60/131,377 filed Apr. 28, 1999, and of U.S. Provisional Application Ser. No. 60/134,656 filed May 18, 1999.

The present invention relates to a method for making an article having an electronic device embedded therein.

The plastic "credit card" has seemingly become ubiquitous. Not only are plastic cards in use worldwide for purchasing goods and services, whether through credit or debit type accounts, but they are rapidly coming into use for many other uses, such as membership cards, library cards, identification cards, access cards, driver's licenses and the like. With the increasing use of plastic cards has come the increasing misuse thereof, whether by thieves or persons seeking unauthorized access or a false identification.

The first innovation to make these ubiquitous plastic cards easier to use and more secure against misuse was the addition of a stripe of magnetic material in which can be encoded information facilitating the use of the cards, such as account numbers and expiration dates, as well as security information, such as personal identifying information and PIN numbers. The magnetic stripe has the advantage of being easy and inexpensive to manufacture and encode. The proliferation of these cards is aided by an International Standardizing Organization (ISO) standard for the dimensions and stripe properties for such cards. Thereafter followed the addition of an embossed "holographic" or diffraction grating optical patch that changed color and/or design as viewed from different angles onto the cards. These optical devices had the advantage that they were very inexpensive to manufacture, but the manufacturer needed sophisticated and expensive machinery to do so, thereby making counterfeiting impractical.

Alas, the ingenuity of the thieves and counterfeiters has enabled them to also reproduce magnetic stripe plastic cards and even embossed optical patch security features. To achieve greater security, a more sophisticated information repository was needed that is also more difficult to counterfeit, or at least one that is more expensive and requires sophisticated production machinery. The embedded electronic device, in particular the semiconductor chip, has provided the best solution thus far. Such electronic devices may include a memory device, a microprocessor, or a combination thereof, and are conventionally embedded in a cavity formed in a plastic card blank. Electrical signals are coupled into and out of such embedded electronic devices either by direct electrical contact to contact pads on the plastic card in the case of "direct contact type" cards or tags, or by radio-frequency (rf) signaling between a card reader and a receiver/transmitter antenna embedded in the card in the case of "contact-less type" smart cards or tags. A plastic card including one or more embedded electronic devices is often referred to as a "smart card."

Conventionally, smart cards are commonly made of rigid polyvinyl chloride (PVC), however, PVC is gradually being replaced by polyester thermoplastic (PET) resin. The properties of these thermoplastic resins, particularly the melting temperature, dictate for the most part which of the available manufacturing processing techniques have suitable temperature and time exposures and so may be employed. PVC resin typically softens and deforms at a temperature around 60–80° C., depending on the amount of plasticiser used in the processing of the PVC card substrate. Typically, the electronic device is mounted to and is electrically connected to one side of a small printed wiring electronic substrate by wire-bonding connections using very fine gold or aluminum wires. This small substrate is necessary because the bonding of the gold wires must be performed at a temperature of 150–250° C. which is higher than the thermoplastic card substrates can withstand. After wire-bonding the input/output connections of the electronic device to the electronic substrate with gold or aluminum wires, the electronic device is then encapsulated to the electronic substrate with a glob of resin for both mechanical and environmental protection. This intermediate electronic substrate with an electronic device wire-bonded thereto forms a module that is subsequently bonded onto a cavity machined or otherwise formed in the card substrate, which bonding is performed at a temperature around 60° C.

Figure 1:
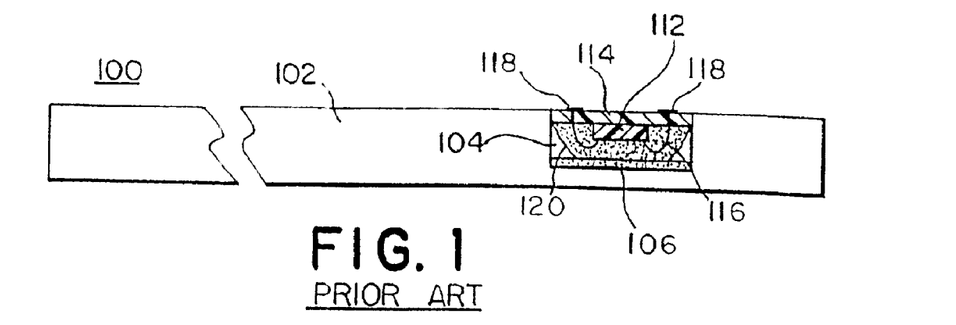
FIG. 1 is a cross-sectional side view of a prior art smart card of the direct contact type.

FIG. 1 is a cross-sectional side view of a prior art smart card 100 of this type. Plastic card blank or substrate 102 has a cavity 104 formed therein. An electronic module 110 includes an electronic device 112 attached to one side of an electronic substrate 114, which may be of type FR4 printed circuit board material, for example. Conventional conductive epoxy that cures at a temperature of about 150° C. attaches electronic device die 112 to substrate 114. Input/output connections from electronic device 112 are connected by bond wires 116 to contact pads on electronic substrate 114 which connect to external contacts 118 on the other side thereof. Electronic device 112 is encapsulated to electronic substrate 114 by encapsulant 118 which may be either dispensed thereon or molded thereto, typically at a temperature of about 150° C. A quantity of adhesive is dispensed into cavity 104 of card substrate 102 and then module 110 is inserted therein to complete smart card 100. One problem associated with this method of assembly is the need to precisely control the dispensing of both encapsulant 120 and adhesive 106 so that the external surface of substrate 114 when fully inserted into cavity 104 is substantially co-planar with the one surface of card substrate 102. In practice, this is difficult to achieve. In fact, the top of cured encapsulant 120 is typically ground off to obtain the controlled thickness and parallel surface necessary for proper assembly into a card. Another disadvantage results from the individual handling and multiple wire bonds required for each electronic device, and from the separate individual glob-type encapsulation process. Each of these operations increases the cost of conventional smart card 100, so that the cost of each card can be as high as $0.50–$1.00 US per card when purchased by the customer. Little improvement is possible with conventional methods, except possibly by using adhesives that bond and cure faster to reduce the process time required to attach module 110 to card substrate 102. Current production adhesives typically cure at a relatively low temperature, e.g., less than 60° C. for a reasonable time, e.g., 30 minutes or longer.

Similar processes of wire bonding and assembling of electronic devices into a smart card are employed for card substrates formed of PET resin. The properties of PET resin differ from those of PVC primarily in the higher softening and deformation temperatures of PET of about 110–130° C. With PET resin card substrates, the electronic device module attachment may be performed at slightly higher temperature, for example, around 120° C. without causing a major problem This opens up additional possible uses of smart cards in higher temperature environments, if smart cards having appropriate properties are available, but with the same problems and disadvantages as set forth above for PVC cards.

Direct-contact type smart cards are also limited by the number of contacts that are available between the smart card and the card reader, as well as the durability and reliability limitations of electro-mechanical contacts. A long-term solution that avoids these limitations of smart card utilizes wireless communication methods to communicate with a contact-less smart card. Because the card need not be in physical contact with the card reader, but only need be "near" the reader, a contact-less smart card is particularly suited important for fare and toll collection. access control, time-attendance, and other conventional smart card applications. The characteristics of the particular RF wireless communication link between the smart card and the card reader determine what is "near" in a particular application, whether that be a matter or inches, feet or yards, or a greater distance.

Figure 2A:
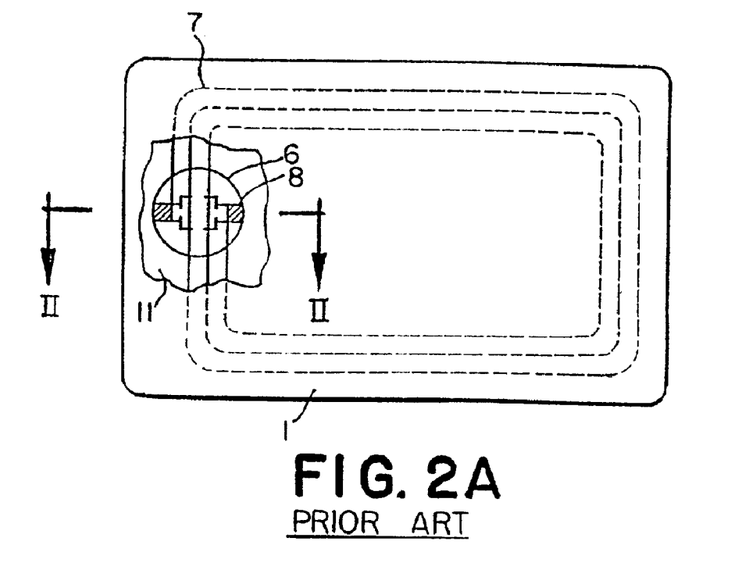
FIGS. 2A and 2B are plan and cross-sectional side views, respectively, of a prior art smart card of the contact-less type.
Figure 2B:
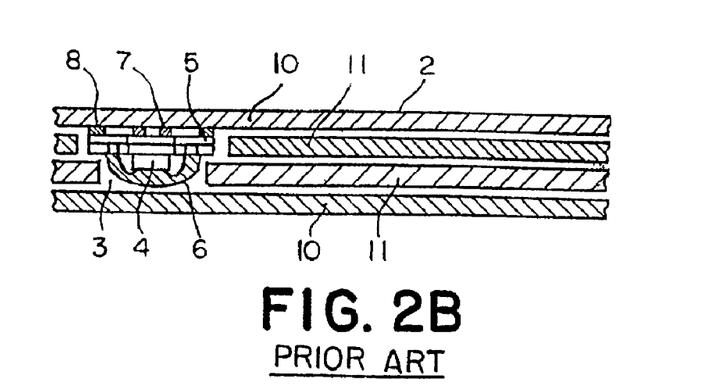

A typical prior art contact-less smart card 1, for example, a "Data Carrier Having Separately Provided Integrated Circuit and Induction Coil"of U.S. Pat. No. 5,880,934, is shown in plan and cross-sectional side views in FIGS. 2A and 2B. Prior art contact-less card 1 has two outer substrates 10 on one of which is deposited an induction coil 7 having coil leads 8 formed by one of conventional screen printing an electrically-conductive adhesive, applying an electro-conductive coating by hot stamping, punching out of a metal foil or an electro-conductively coated plastic film. Separately, a module 6 is fabricated by attaching an integrated circuit 4 to contact elements 5 of a substrate of module 6 by wire bonding and covering integrated circuit 4 with a glob of encapsulating material, although integrated circuit 4 could be attached to the substrate of module 6 in a conventional manner by bonding the contact pads thereof to contact elements 5 using electrically conductive adhesive. Module 6 is then attached to top layer 10 by connecting contact elements 5 of module 6 to coil leads 8 of induction coil 7 using electrically conductive adhesive. A conventional card blank having a stepped cavity 3 therein for receiving integrated circuit module 6 is prepared by laminating two inner layers 11 each having an opening 3 of different dimension therethrough that together form a stepped opening 3. Alternatively, one inner layer 11 having a stepped opening 3 formed therein as by molding, machining or hot-forming could be employed, or the inner layers 11 could be laminated to the bottom outer layer 10 before module 6 is inserted into opening 3. Finally, top cover 10 and the prepared card blank of layers 11 are positioned so that module 6 extends into stepped opening 3 and the cover and inner layers 10, 11 are laminated together, for example, between flat plates at a temperature and for a time appropriate for the layers 10, 11 to form a permanent bond of the complete contact-less card 1.

Due to the many separate steps in the manufacture of prior art smart cards, the current cost of a contact-less smart card made by conventional methods is several times more than that of a direct-contact type smart card, and so tends to prevent the wider use of smart card technology. While the cost of the electronic device may be increased slightly by the need for transmitting and receiving circuits, that cost is overshadowed by the cost of packaging and assembling the contact-less card. The reason the packaging cost is quite a bit more than that of contact type cards is principally due to the need for an embedded antenna and a separately packaged and tested module including the electronic device. In particular, the RF loop antenna must be formed on a substrate, whether by attaching a loop of wire or other conductor thereto or by depositing a loop of conventional thick-film conductive ink thereon as described above. Curing the deposited, attaching the electronic device to the substrate by conventional adhesive dispensing, and curing, and adhesively laminating the substrate to the card substrate, all add production steps, time and cost. All this is similar to the problems associated with conventional assembly processing for prior art direct-contact type smart cards.

Accordingly, there is a need for a card that is simpler and less expensive to make and for a method for making a card that avoids the need to individually handle, wire bond and encapsulate electronic devices. It would be desirable that such method lend itself to automated processing as may be suitable for higher-speed and higher volume production than are available under the conventional methods described above.

To this end, a method for making an article having an electronic device embedded therein comprises:

providing a substrate having first and second opposing surfaces;

mounting an electronic device on the first surface of the substrate; and applying a layer of melt-flowable adhesive of substantially uniform thickness on the first surface of the substrate to cover the electronic device, wherein the electronic device is encapsulated by the layer of melt-flowable adhesive.

BRIEF DESCRIPTION OF THE DRAWING

The detailed description of the preferred embodiments of the present invention will be more easily and better understood when read in conjunction with the FIGURES of the Drawing which include.

DESCRIPTION OF THE PREFERRED EMBODIMENT(S)

Figure 3:
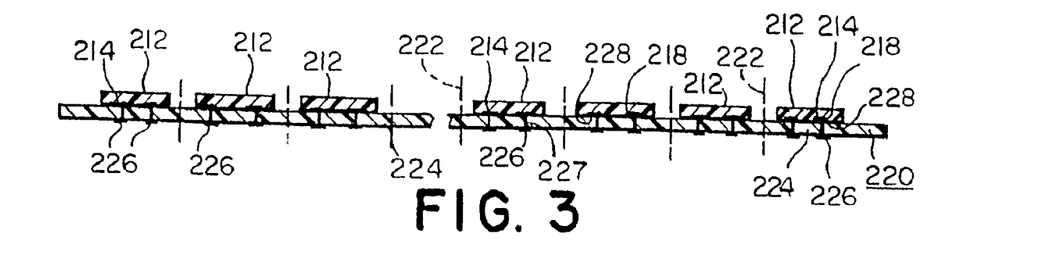
FIG. 3 is a cross-sectional side view of a panel of electronic substrates and a plurality of electronic devices in accordance with the present invention.

FIG. 3 is a cross-sectional side view of a panel 220 of electronic substrates employed in the method for making smart cards or other articles in accordance with the present invention. Panel 220 is intended to be cut apart or singulated at dashed cut lines 222 to produce a plurality of individual electronic substrates 224. Panel 220 is typically formed of a conventional printed wiring circuit board material, such as FR4 material, but may be formed of other suitable electronic substrate materials, such as a flexible circuit of polyimide or other plastic material or alumina, ceramic, and the like. Panel 220 has a pattern of contact pads formed on each of the broad surfaces thereof. The pattern of contact pads 226 on one surface of substrate panel 220 includes groups of contact pads 226 each associated with one of the individual substrates 224 and arranged relatively for making direct contact with a card reader for the smart card, in accordance with the applicable standard therefor, such as an ISO standard. The ISO standard size for contact-type cards is about 85.725 mm by 53.975 mm by 0.787 mm (about 3.375 inch by 2.125 inch by 31 mils). A corresponding pattern of contact pads 228 on the opposing surface of substrate panel 220 includes groups of contact pads 228 each of which is associated with one of the individual substrates 224 and is electrically connected to the corresponding contact pads 226 by conductive vias 227 through substrate 220. An electronic device 212 is to be attached to the group of contact pads 228 on each particular individual substrate 224.

Thereafter, a plurality of electronic devices 212 are attached to substrate panel 220, as by conventional pick-and-place equipment or other suitable placement mechanism, and are bonded thereto by electrically conductive interconnects 218 formed from features or bumps of electrically-conductive material that are deposited on the contact pads 228 of substrate panel 220 or on the contact pads 214 of electronic device 212 prior to attachment. Preferably, conductive bumps 218 are deposited on the contact pads 228 of a large number of individual substrates 224 that have been formed on substrate panel 220. Substrate panel 220 is later separated into individual circuit substrates 224.

Alternatively, conductive bumps 218 can be deposited on the contact pads 214 of electronic device 212 rather than on the contact pads 228 of substrate panel 220. In this arrangement, it is preferred that the conductive bumps 228 be deposited onto the contact pads 214 of the electronic devices 212 before the electronic devices 212 are separated into individual devices, e.g., after the electronic devices 212 are formed on a semiconductor wafer, but before the semiconductor wafer is diced or singulated into individual semiconductor die each containing an electronic device 212.

Conductive bumps 218 are deposited onto substrate 220 or electronic devices 212 by screen printing, stenciling, mask printing, ink-jet printing or other suitable method, and are allowed to dry or B-stage. An advantage of the foregoing method is that conductive bumps are deposited on a large number of substrates or electronic devices in a single operation, thereby avoiding the time and expense of dispensing of adhesive to form individual bumps or groups of bumps.

Electronic devices 212 are then attached to substrate panel 224 as follows: Where conductive bumps 218 are solder bumps, such as my be formed by the conventional "C4" solder bumping and connection process, substrate 220 is heated to a temperature less than the reflow temperature of solder, i.e. less than about 220° C. for tin-lead eutectic solders, and electronic devices 212 are heated to a temperature higher than the melting temperature of solder and are placed against substrate panel 220 in the proper locations. Upon contact, the solder bumps 218 melt and then solidify to form solder interconnections 218 between the contact pads 214 of electronic device 212 and the corresponding contact pads 228 of substrate panel 220. A like attachment process is employed where the conductive bumps 218 are formed of a thermoplastic conductive adhesive bumps 218 or a rapid curing B-stageable thermosetting conductive adhesive and the substrate panel 220 is heated to a temperature less than the melt flow temperature of the conductive adhesive and the electronic device 212 is heated to a temperature higher than the melt flow temperature of the conductive adhesive. High temperature materials, such as solder or high melt temperature adhesives, may be employed in this stage of fabrication because both the electronic devices 212 and the substrate 220, which is typically an FR4 or other conventional printed wiring circuit board material or other suitable electronic dielectric substrate, can withstand such temperatures.

Figure 4:
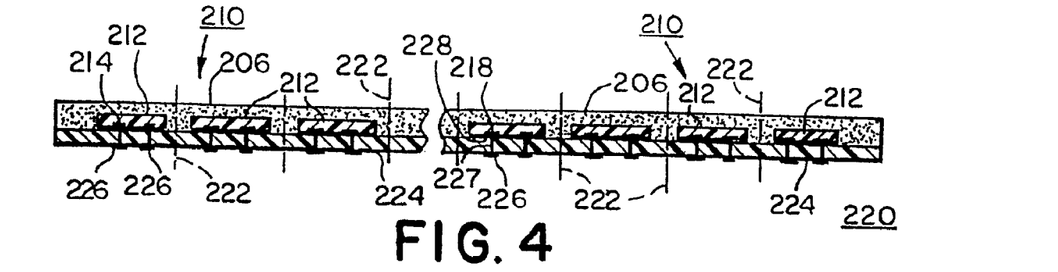
FIG. 4 is a cross-sectional side view of the panel of electronic substrates and electronic devices of FIG. 3 having an adhesive layer thereon.

In FIG. 4, substrate panel 220 of electronic substrates 224 having electronic devices 212 attached thereto, is covered with an adhesive layer 206 of uniform thickness that encapsulates electronic devices 212 and is to serve as an adhesive for assembly of substrates 224 into smart cards. Adhesive layer 206 is formed of an insulating thermosetting or thermoplastic adhesive that is applied by roll coating, screening, stenciling or other wise applying an adhesive in liquid or paste form over the surface of substrate panel 220 on which are attached electronic devices 212, and then drying or B-staging the adhesive. Adhesive layer 206 may also be formed by laminating a sheet of dry or B-staged insulating thermosetting or thermoplastic adhesive onto the surface of substrate panel 220 on which are attached electronic devices 212 under suitable temperature and pressure to attach, but not cure, the adhesive material. The result is a panel of a plurality of electronic modules 210 that are attached together, each electronic module 210 including an electronic device 212 attached to an electronic substrate 224 and encapsulated by a layer 206 of insulating adhesive of substantially uniform thickness. Advantages of this method include that all of the electronic modules 210 are encapsulated in a single operation that produces a flat adhesive surface parallel to the circuit substrate, and that the material 206 utilized serves both as an encapsulant of electronic device 212 and as an adhesive in subsequent assembly. Substrate panel 220 is then cut or singulated into individual electronic modules 210 for assembly into a smart card. It is noted that not only is the thickness of the adhesive layer 206 uniform, but the thickness is controllable and consistently repeatable so that cards are not rejected because the substrate 224 either protrudes from or is recessed under the surface of the card blank, as can occur to a much greater extent under the conventional assembly method. In addition, because the adhesive layer 206 conforms to the electronic device 212 it surrounds, there is no need for an underfill of insulating adhesive, thereby avoiding additional processing.

Figure 5:
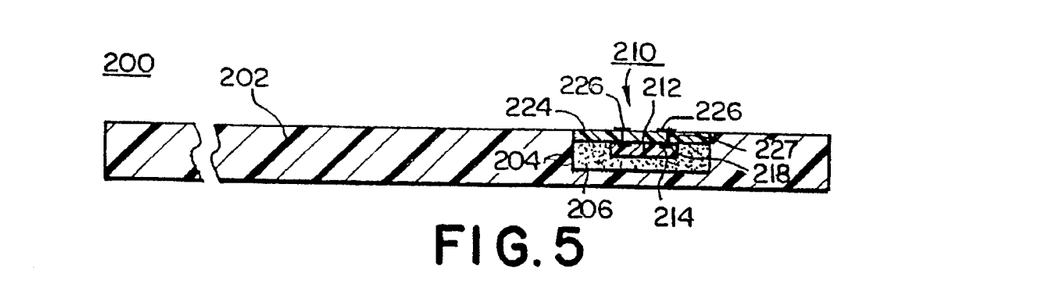
FIG. 5 is a cross-sectional side view of an embodiment of a contact type smart card including an electronic substrate and electronic device according to FIG. 4.
Figure 6:
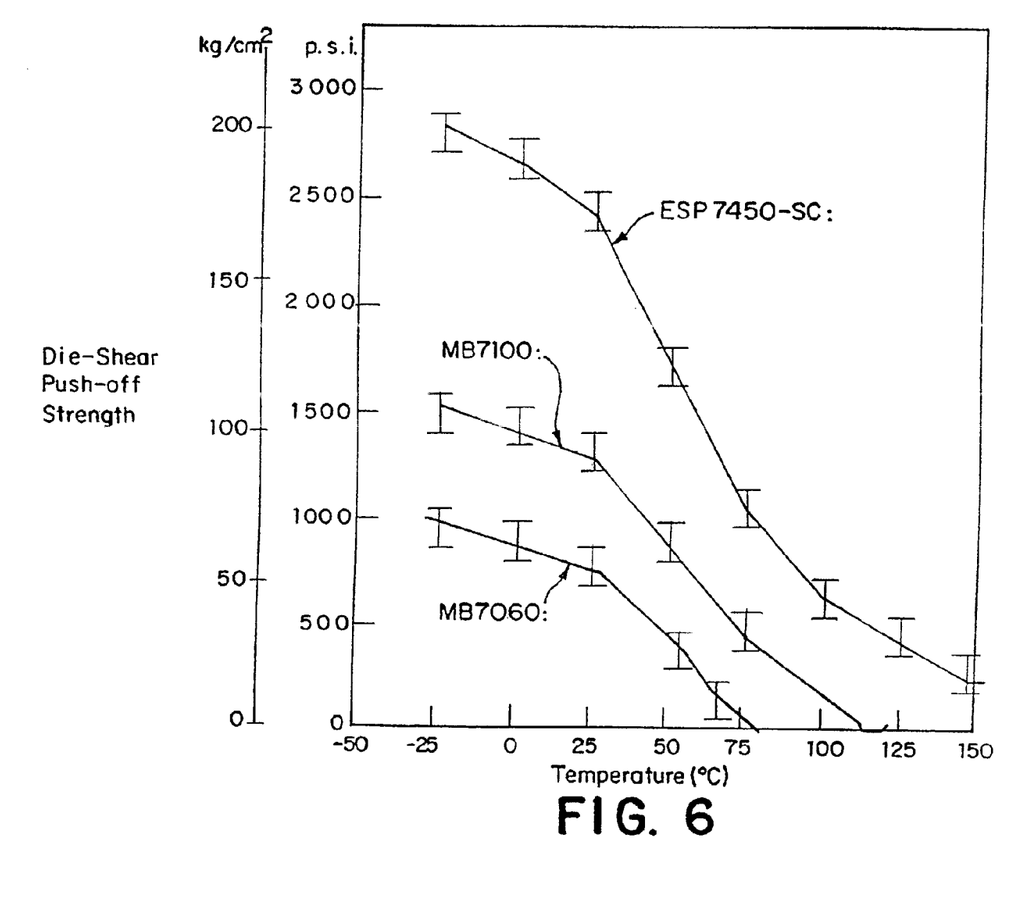
FIGS. 6 and 7 are graphical representations of the strength characteristics of certain materials useful with the present invention over a range of temperature and over time of exposure to moisture, respectively.
Figure 7:
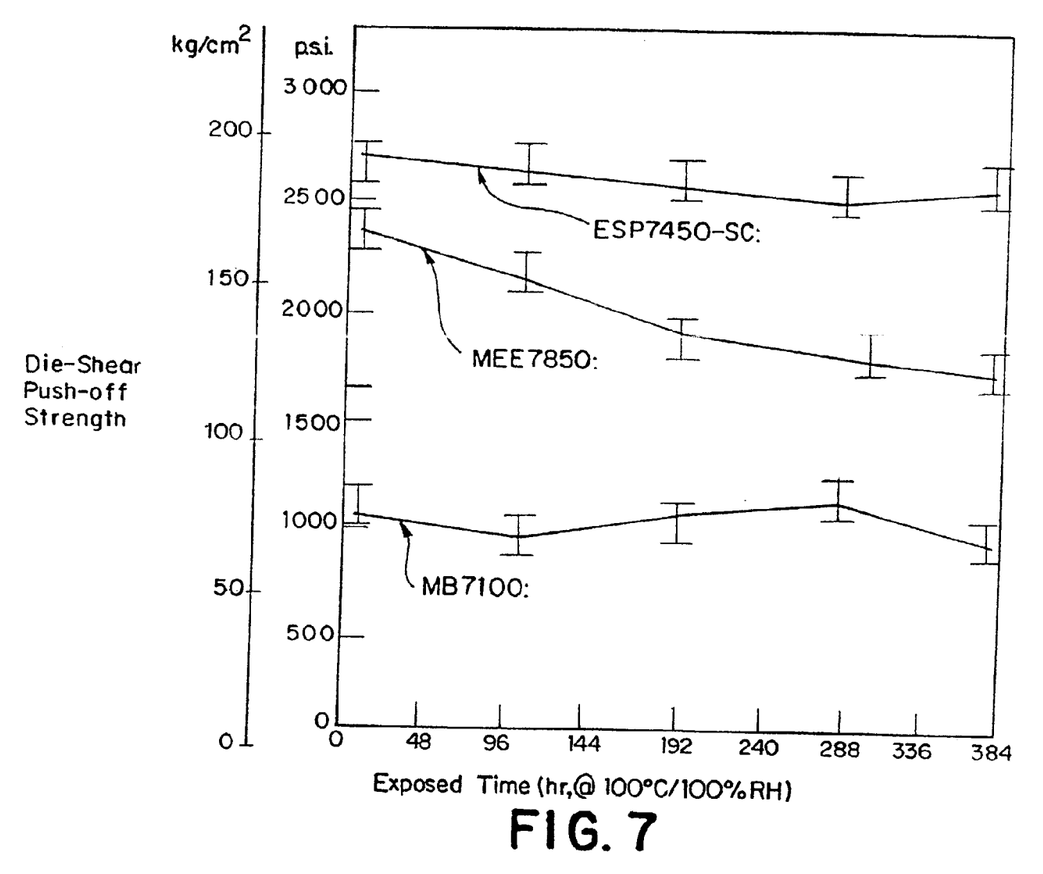

FIG. 5 is a cross-sectional side view of an exemplary embodiment of a complete direct-contact smart card 200 or like article including an electronic module 210 having a substrate 224 and an electronic device 212 according to FIG. 4. Card blank 202, which may be of PVC, PET, acrylonitrile-butadiene-styrene (ABS), high-impact polystyrene (HIPS), polyimide, polyester, or other plastic, or other suitable material, has a cavity or recess 204 therein that is sized to receive electronic module 210 therein and is located on blank 202 in accordance with the applicable ISO or other standard. Electronic module 210 is placed into cavity 204, for example, by automated pick-and-place equipment or other suitable placement means, and bonded in place by adhesive 206 thereof.

Where card blank 202 is of rigid PVC which has a deformation temperature of about 60–80° C., an adhesive that bonds at a temperature below about 80° C. is preferred. One suitable thermoplastic adhesive that melts and bonds instantly when pressed against PVC under a pressure of about 5 psi (about 0.35 kg/cm$^2$) at a temperature of 70° C. is type MB7060 adhesive which is available commercially in sheet form from AI Technology, Inc., located in Princeton, N.J. Where card blank 202 is of PET which has a deformation temperature of about 120° C., an adhesive that bonds at a temperature below 120° C. is preferred. Suitable thermoplastic adhesives that melt and bond instantly when pressed against PET under a pressure of about 5 psi (about 0.35 kg/cm$^2$) include type MB7060 which bonds at a temperature of about 65–75° C., type MB7070 which bonds at a temperature of about 70–90° C., and type MB7100 which bonds at a temperature of about 110° C., all of which are commercially available in sheet form from AI Technology, Inc. Type MB7060 may be bonded at a lower temperature, such as 60° C. if a higher pressure is utilized, as is the case with types MB7070 and MB7100 as well. Further, where a high temperature and high-strength bond is desired, an epoxy adhesive, such as type ESP7450-SC thermosetting epoxy adhesive available from AI Technology, may be employed. Type ESP7450-SC has a high bond strength up to temperatures of about 125–150° C., yet is flowable (under a pressure of about 5 psi (about 0.35 kg/cm$^2$)) and curable in less than 30 minutes at a temperature of about 80° C. Each of these adhesives has a die-shear strength greater than 500-1000 psi (35-70 kg/cm$^2$) at temperatures below about 45° C. as is illustrated by the die shear characteristics of FIG. 6, although a bond strength of about 200 psi (about 14 kg/cm$^2$) at temperatures below about 45° C. is sufficient for many smart card applications. In addition, these adhesives are insensitive to exposure to moisture as is desirable for cards to be used in tropical climates, or to track items being laundered or otherwise processed, as is illustrated by the die shear strength moisture exposure characteristics of FIG. 7.

Where electronic devices 212 are attached or bonded to substrate 220 by deposited bumps 218 of an electrically conductive adhesive, preferred adhesives are thermoplastic and thermosetting adhesives that are "flexible" when cured, i.e. adhesives that have a modulus of elasticity that is less than about 500,000–1,000,000 psi (about 35,000–70,000 kg/cm$^2$) over most of the range of temperatures that the bonded electronic device 212 is specified to operate over. Suitable conductive adhesives include types PSS8090 and PSS8150 thermosetting paste adhesives which are melt-flow bondable at temperatures of about 120° C. and 200° C., respectively, and are available from AI Technology, Inc. Type PSS8090 may be melt-flow bonded at a lower temperature, such as 100° C., if a higher pressure is utilized, as is the case for type PSS8150 as well. If it is desired to employ an adhesive underfill between electronic device 212 and substrate 224, an insulating adhesive that will be drawn under the electronic device 212 when dispensed and having a modulus of elasticity no greater than that of the conductive adhesive utilized for the conductive electrical connections 218 should be employed. For example, type MEE7650 flexible insulating thermosetting epoxy adhesive available from AI Technology, which has a modulus of elasticity of about 10,000 psi (about 700 kg/cm$^2$), is suitable for use with types PSS8090 and PSS8150 conductive adhesives, as is type MEE7650-5 which is more flexible.

Figure 8:
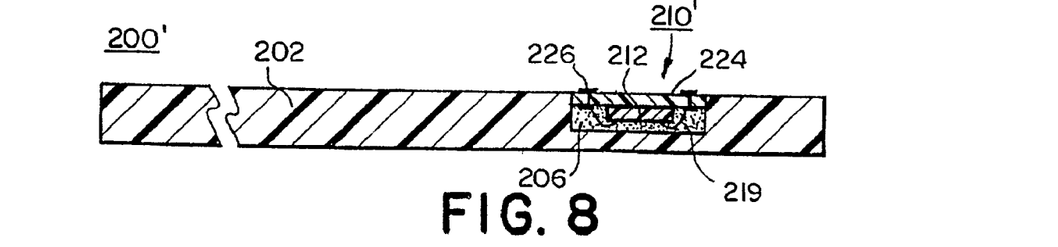
FIG. 8 is a cross-sectional side view of an embodiment of the smart card of FIG. 5 including an alternative electronic substrate and electronic device.

FIG. 8 is a cross-sectional side view of an alternative embodiment of a smart card 200' including an electronic module 210' in which electronic device 212 is wire-bonded to substrate 224. Other than for electronic device 212 being mounted to substrate 224 with its contact pads 214 on the side thereof away from substrate 224, with wire bonds 219 electrically connecting contact pads 214 of electronic device 212 to contact pads 228 of substrate 224, card 200' is like card 200 described above and is fabricated in the same manner. Specifically, electronic devices 212 are mounted to a panel 220 of substrates 224 by a standard conductive epoxy attachment, typically cured at 150° C., and are connected to the contact pads thereof by bonding wires 219, such as gold wires bonded at 150–200° C. Then adhesive layer 206 is applied to encapsulate electronic device 212 and provide a uniform thickness of adhesive for bonding electronic modules 210' into respective cavities 204 in card blanks 202 as above, after substrate 220 is singulated into individual electronic modules 210'. Adhesive layer 206 may be applied in liquid or paste form as by screening, stenciling, masking, ink-jet printing or other suitable method or may be ah adhesive sheet laminated to substrate 220.

Advantageously, the separate operations of first glob encapsulating the electronic devices and then dispensing adhesive to bond them into the card blank are eliminated. However, even if electronic devices 212 were to be glob encapsulated and cured, typically at 150° C., the method according to the present invention could still be employed to form an adhesive layer 206 thereover having uniform thickness for proper bonding into cavity 204 of card blank 202 at a suitably low temperature.

Figure 9:
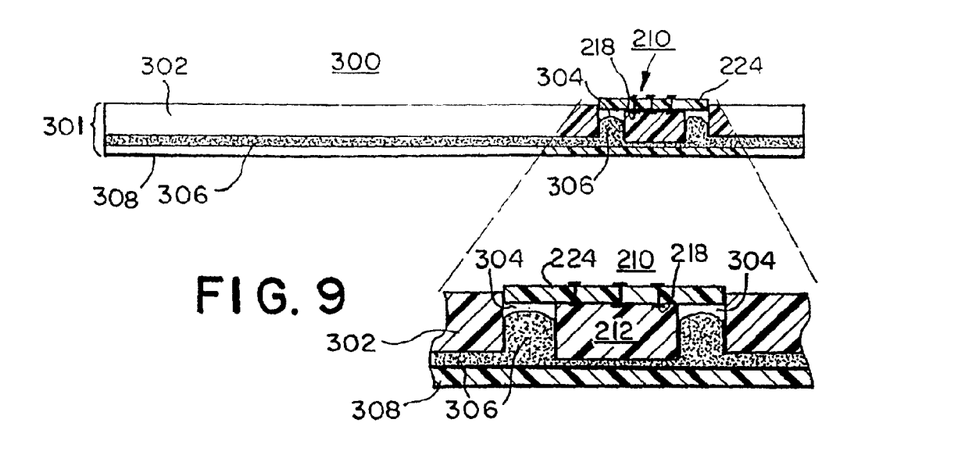
FIGS. 9 and 10 are cross-sectional side views of further alternative embodiments of a contact type smart card including an alternative substrate.

FIG. 9 is a cross-sectional side view of an embodiment of a contact type smart card 300 including an alternative laminated substrate 301. Rather than a substrate 202 having a cavity 204 of given depth into which an electronic module 210 is placed as described above in relation to cards 200 and 200' of FIGS. 5 and 8, card 300 has a substrate 302 having a pre-cut through hole cavity 304 therein for receiving electronic module 210. A thin base substrate 308 of suitable card material, e.g., PVC, PET, polyimide, or other plastic, is coated with a thin layer of compatible melt flowable adhesive 306 and is laminated to substrate 302 which is of like substrate material. Adhesive layer 306 may be relatively thin, e.g., about 50 $\mu$m (about 2 mils) or may be relatively thick, e.g., about 500 $\mu$m (about 20 mils) as compared to the total thickness of card 300, e.g., 0.78 mm (about 31 mils). If the electronic module 210 is relatively thin and has parallel front and back surfaces, as with a ground glob-top module, then a relatively thin adhesive layer 306 is sufficient. If the electronic device of the module is thicker and so extends substantially from the individual substrate to which it is attached, then a thicker adhesive layer 306 is desirable. The thickness of substrate 302 may be slightly greater than the thickness of the electronic device 212 of module 210, particularly where the electronic device 212 is relatively thin, and the thicknesses of base substrate 308 and adhesive layer 306 are selected so that the total thickness of card 300 is compatible to the applicable card standard. Electronic module 210 is the same as described above in relation to FIGS. 3–5.

As is shown in the expanded inset portion of FIG. 9, upon lamination of card substrate 302, adhesive layer 306 and substrate 308 to form card 300, the electronic device 212 of module 210 extends into the adhesive of adhesive layer 306 causing adhesive to flow into cavity 304 in card substrate 302, thereby embedding electronic module 210 in adhesive layer 306 to secure module 210 in proper position relative to card substrate 302 and card 300. Preferably, cavity 304 is about 75% filled with adhesive from adhesive layer 306. Although greater or lesser thicknesses of adhesive layer 306 may be employed to increase and decrease the filling of cavity 304, it is undesirable that adhesive overflow cavity 304 when module 210 is inserted therein or that module 210 not be sufficiently embedded into adhesive layer 306, and the thickness of adhesive layer 306 should be controlled to avoid such conditions.

It is noted that the substantial thickness of the adhesive layer 306 that may be employed in a card according to the present invention reduces the thickness of the card substrate 302, serves as part of the structure of the card as well as an adhesive, and facilitates construction of a card 300 having fewer substrate layers, e.g., only two substrate layers 302 and 308. This is a substantial advantage as compared to a conventional card which requires at least three or four layers, including the two layers required to form the stepped cavity or hole into which a conventional electronic module is inserted, and which must be properly registered for such purpose. Additionally, the use of special adhesives that must be precisely dispensed onto the shoulder of the cavity of the prior art cards for bonding the edges of the contact module thereto is eliminated in the present invention. Further, the lower lamination temperatures of the present invention avoid the need to heat the PVC substrates to temperatures approaching their melt-flow temperatures at which it becomes difficult to preserve the printable quality of their surface finish.

Card 300 is made as follows. A 2–5 mil thick (0.05–0.13 mm) layer of type MB7060 adhesive available from AI Technology is applied onto a 2–10 mil (0.05–0.25 mm) thick sheet of PVC base substrate 308 material, by laminating a sheet of such adhesive thereto or by roll coating, screening, stenciling or other suitable method for depositing adhesive thereon. A sheet of 12–18 mil thick (0.3–0.45 mm) PVC substrate 302 material having die-cut through-hole cavities 304 therethrough is laminated with the sheet of base substrate 308 material and adhesive layer 306 to form laminated substrate 301 having, for example, a thickness consistent with the applicable ISO standard, i.e. about 0.78 mm (about 31 mils). The thickness of substrate 302 is selected consistently with the thickness of the electronic device or module that will reside in the cavities 304 therethrough. Lamination is performed at a temperature of about 65–75° C. for annealed PVC substrate materials. Cavities 304 are located relative to each other so that when the sheet of laminated substrates 301 is cut into individual card substrates, cavities 304 will be in the position prescribed by the applicable card standard. It may be advantageous to employ guide holes or other indexing indicia in the sheet of laminated substrates 301 in a known predetermined positional relationship to the cavities 304 to facilitate placement of electronic modules 210 into cavities 304 and/or the singulation of the sheet of laminated substrates 301 into individual substrates 301 or cards 300. Electronic modules 210 are placed and bonded into the respective cavities 304, such as by standard pick-and-place equipment, with their respective contact pads 226 exposed. Preferably, laminated substrate 301 is heated to a temperature of about 65–75° C. and electronic module 210 is pressed into cavity 304 with a pressure of about 3–10 psi (about 0.2–0.7 kg/cm$^2$)to flow the type MB7060 adhesive. The sheet of completed cards is then printed with the appropriate customer information and is cut or singulated into individual cards 300. Alternatively, the cover or outer layers may be preprinted in a web or panel form having suitable guide holes or other indicia for proper positioning and registration.

Figure 10:
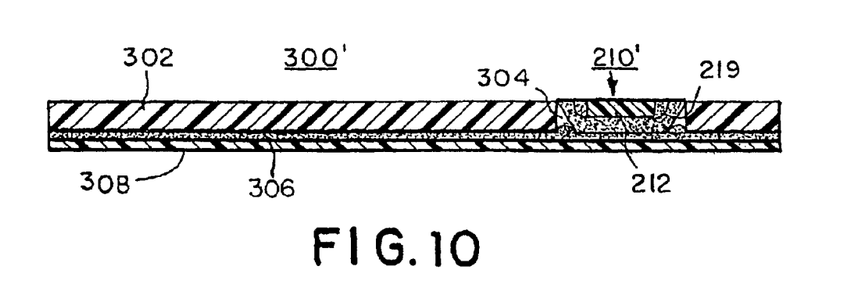

FIG. 10 is a cross-sectional side view of a further alternative embodiment of a contact type smart card 300' that is the same as card 300 except that a glob-encapsulated wire-bonded module 210' as described above in relation to FIG. 8 is bonded into cavity 304 of card substrate 302. Card 300' is made by the same process as is card 300 described above, and may utilize the same materials and adhesives. In like manner to card 300, upon lamination to form card 300', adhesive from adhesive layer 306 flows into cavity 304 in card substrate 302 embedding electronic module 210' therein to secure module 210' in proper position relative to card substrate 302 and card 300'.

Alternatively, the sheet of laminated substrates 301 may be singulated into individual laminated substrates 301 before an electronic module 210, 210' is placed and bonded into cavity 304 at the temperature and pressure stated above. Also, the thicknesses of substrate 302, adhesive layer 306 and base substrate 308 may be varied to obtain different card 300, 300' thicknesses, however, the thickness of the adhesive layer 306 should be selected for proper adhesive flow when laminating substrate 301 to the desired thickness. The materials described above in relation to cards 200, 200' such as PET and type MB7100 adhesive, for example, may also be employed in making cards 300, 300'.

It is noted that other contact modules may be employed in the articles and methods described herein. For example, the contact modules described in U.S. patent application Ser. No. 09/412,052 entitled "Contact Module, As For A Smart Card, And Method For Making Same" filed by Kevin K-T Chung on Oct. 4, 1999, now U.S. Pat. No. 6,288,905 which application is incorporated in co-pending parent application Ser. No. 09/412,058 and herein by reference it its entirety, may be employed.

Figure 11:
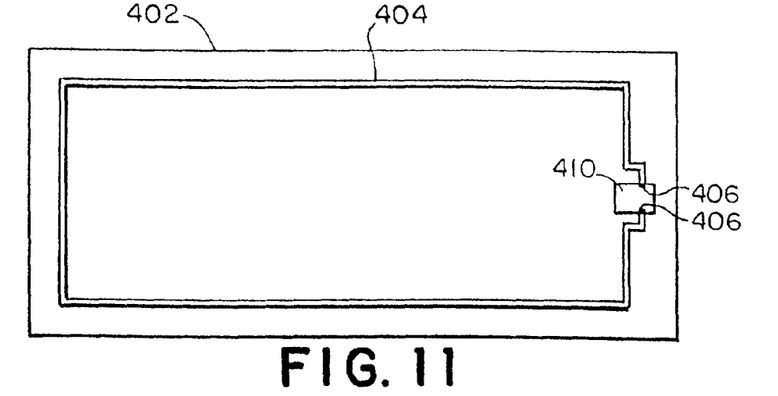
FIGS. 11 and 12 are a plan view and a side view, respectively, of an exemplary substrate for a contact-less card according to the present invention.
Figure 12:
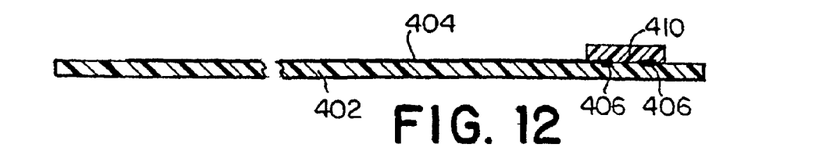

Contact-less cards, on the other hand, are advantageous because they do not require the making of electromechanical contact with a card reader, and so not only do they avoid the potential poor-contact problems caused by contamination, oxidation and corrosion, but they also may operate with a card reader over an RF link covering a substantial distance. FIGS. 11 and 12 are plan and side views, respectively, of an exemplary substrate 402 for a contact-less card 400 having an electronic device embedded therein. Substrate 402 is formed of a thin sheet of substrate material, such as PVC, PET, ABS or HIPS, polyimide, polymer film, or other plastic, or paper film, or other suitable material, on which is deposited an elongated electrical conductor 404 that serves as an RF loop antenna 404. Antenna 404 is formed of a thermoplastic or thermosetting polymer adhesive that is made electrically conductive by the inclusion of electrically conductive particles therein. Electronic device 410 is attached to substrate 402 in a flip-chip manner by electrical connections 406 that bond the contact pads thereof to the ends of the elongated conductive pattern 404 of conductive adhesive that serve as the contacts of RF loop antenna 404. Connections 406 to electronic device 410 at the ends of conductive pattern 404 may be made while the conductive adhesive thereof is wet by placing electronic device 410 thereon or conductive adhesive pattern 404 may be dried or B-staged before electronic device 410 is placed to contact the ends thereof by melting or curing the conductive adhesive. As a result, and beneficially, the substrate is made in a single deposition rather than requiring the deposition of a thick-film ink to form the antenna conventionally and conductive bumps to form interconnections between the antenna and the electronic device.

A stencil, screen or mask defining the pattern of antenna 404 is employed to deposit electrically conductive adhesive on substrate 402 in the pattern of antenna 404. Typically, the substrate 402 is between about 0.25 mm and 1 mm thick (about 10–40 mils thick), and the conductors forming antenna 404 are about 250 µm (about 10 mils) wide and are within the range of about 25 µm to 125 µm thick (about 0.5 to 5 mils thick). In most cases, the conductors of antenna 404 are about 50–100 µm thick (about 2–4 mils thick) when wet and about 25–75 µm thick (about 1–3 mils thick) after drying or B-staging. Suitable conductive adhesives include, for example, type PSS8150 thermosetting conductive adhesive filled with silver particles which is available from AI Technology, Inc. located in Princeton, N.J. The deposited conductive adhesive is dried or B-staged by heating in an oven. Electronic devices 410 may be positioned to the substrate 402 either when the adhesive is still wet from being deposited or after the conductive adhesive is dried or B-staged.

Where antenna 402 has plural turns and electronic device 410 bridges one or more turns of antenna 404 or other conductors formed of electrically-conductive adhesive, and particularly where the width or spacing of such conductors is small, i.e. less than about 0.25–0.5 mm (about 10–20 mils), the deposited conductive adhesive is preferably dried or B-staged before attachment of electronic device 410. A second deposition of the same electrically-conductive adhesive is made to deposit a second layer of adhesive on bumps 406 to which electronic device 410 may be attached while the second layer of adhesive is wet or after drying or B-staging. However, where the conductor width or spacing is small, it is preferred that attachment of electronic device 410 be after the second deposition of conductive adhesive on bumps 406 has been dried or B-staged.

Optionally, but in many applications, preferably, an insulating adhesive underfill in liquid form may be applied along the edges of electronic device 410 from where it flows by capillary action to substantially fill the remaining volume between electronic device 410 and substrate 402 that is not filled by conductive adhesive. Such adhesive underfill provides additional mechanical strength to the attachment of electronic device 410 to substrate 402 and resistance to moisture and other potential contaminants. Where the electrically-conductive adhesive is a flexible adhesive such as type PSS8150, as is desirable where the substrate 402 is somewhat flexible, a flexible adhesive underfill, such as type MEE7650 or type MEE7650-5 thermoplastic epoxy adhesive also available from AI Technology, is preferably utilized.

Figure 13:
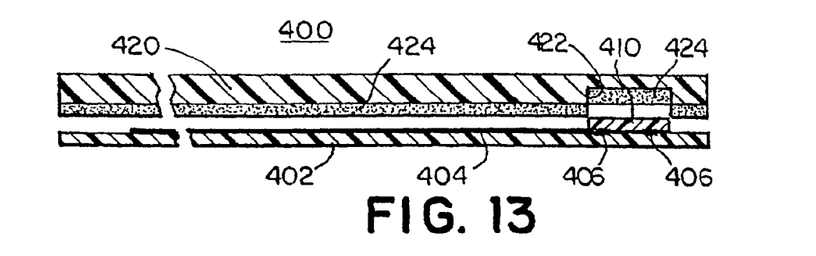
FIGS. 13 and 14 are cross-sectional side views of alternative exemplary embodiments of a contact-less card according to the present invention.

FIG. 13 is a side cross-sectional view of an exemplary card 400 including a substrate 402 as described above. Separately, a card blank 420 of PVC or PET material corresponding to that of substrate 402, having a cavity 422 therein for receiving electronic device 410 is prepared for assembly into a complete card by laminating a melt-flowable adhesive sheet or layer 424 thereto (although, alternatively, and possibly in some cases preferably, the adhesive sheet 424 could be laminated to substrate 402). Substrate 402 and prepared card blank 420 are aligned so that electronic device 410 is positioned to go into cavity 422 of card blank 420. Substrate 402 and card blank 420 are laminated together, for example, between two heated flat plates or between heated rollers, at a temperature and for a time appropriate for adhesive layer 424 to melt flow and form a permanent bond of substrate 402 to card blank 420 to form the complete contact-less card 400, with electronic device 410 positioned in cavity 422 and encapsulated between substrate 402 and card blank 420 by melt-flowable adhesive 424.

Figure 14:
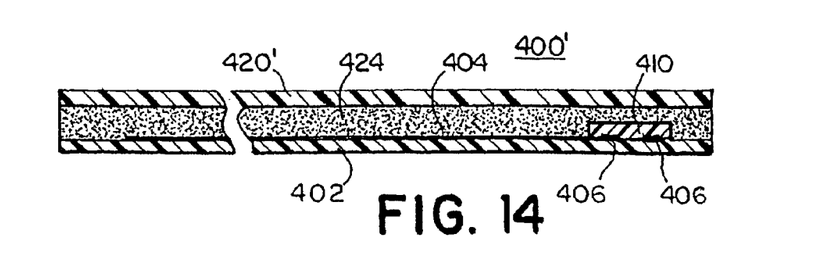

FIG. 14 is a cross-sectional side view of another alternative exemplary embodiment of a contact-less card 400' according to the present invention. Card 400', like card 400 described above, includes a prepared substrate 402 with loop antenna 404 and electronic device 410 mounted thereon as described in relation to FIGS. 11 and 12. Card blank 420' of PVC or PET material corresponding to that of substrate 402, does not have a cavity for receiving electronic device 410, thereby advantageously simplifying the making of card 400' and eliminating a processing step. Substrate 402 is prepared for assembly into a complete card by roll coating a layer 424 or laminating a sheet 424 of melt-flowable adhesive thereto or, alternatively, by laminating an adhesive sheet 424 to card blank 420'. Adhesive layer 424 has a thickness greater than the height (thickness) of electronic device 410 above substrate 402 so that it is sufficient to cover and encapsulate electronic device 410. It is noted that the adhesive of which layer 424 is formed is preferably selected to be of a different type than is the conductive adhesive of which loop antenna 402 and contacts 406 are formed so as to avoid the smearing thereof, such as an adhesive based upon a different chemistry of its molecular and physical structure, such as one being a thermosetting adhesive and the other being a thermoplastic adhesive or two adhesives employing different solvenst so that the solvent of the one adhesive does not affect or dissolve the other adhesive. Smearing is also avoided if layer 424 is formed by laminating a sheet of dried or B-staged, i.e. solvent-free, adhesive to substrate 402. Substrate 402 and card blank 420' are laminated together between heated flat plates or heated rollers, at a temperature and for a time appropriate for adhesive layer 424 to melt flow and form a permanent bond between substrate 402 and card blank 420' thereby to form the complete contact-less card 400' with electronic device 410 positioned and encapsulated between substrate 402 and card blank 420 by melt-flowable adhesive 424.

Figure 15:
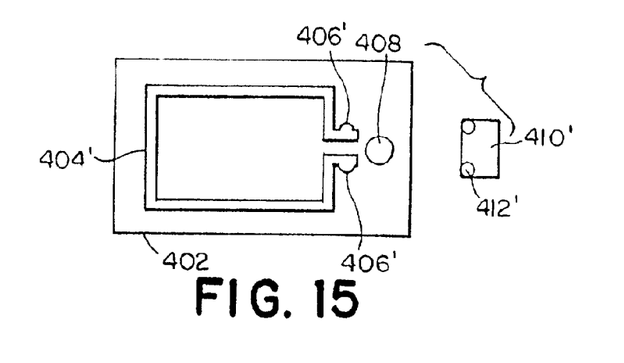
FIGS. 15 and 16 are plan views of an alternative exemplary substrate for a contact-less card according to the present invention.

FIG. 15 is a plan view of a substrate 402 as for cards 400, 400' above in which an alternative arrangement for mounting an electronic device 410' to substrate 402 is employed. Electronic device 410', for example, a semiconductor die, which is illustrated apart from substrate 402, has two contact pads 412' located, for example, spaced apart along opposing edges thereof. RF loop antenna 404' of suitable width and conductivity is deposited, as by screen printing, stenciling or other suitable method for depositing an electrically-conductive adhesive, onto substrate 402 and has at the ends thereof contacts 406' of RF loop antenna 404' spaced apart the same distance as are contact pads 412' of electronic device 410' for making electrical connection thereto. In addition, a support 408 is deposited onto substrate 402 for supporting a part of electronic device 410' apart from contact pads 412' thereof. Support 408 may be deposited at the same time and of the same material as is antenna 404' if the surface of electronic device 410' to which it will be attached is passivated or coated so that the function of electronic device 410' will not be compromised by having electrically-conductive adhesive attached thereto, or support 408 may be deposited separately or of a different material, such as an electrically insulating adhesive. Alternatively, a second deposit of electrically-conductive adhesive may be made onto contacts 406' to increase the height thereof, and a second deposit of adhesive may be made onto support 408 to similarly increase the height thereof.

Figure 16:
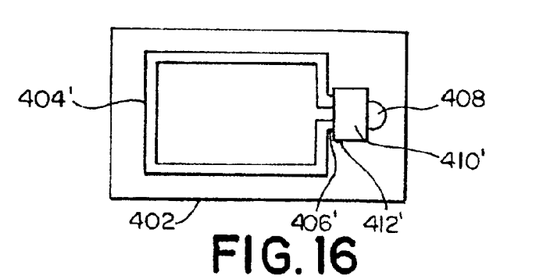

Electronic device 40' is flipped over and mounted to substrate 402, as is shown in FIG. 16, with contact pads 412' connecting to antenna contacts 406' and with electronic device 410 also being supported by support 408. Electronic device 410' can be attached to substrate 402 while the adhesive deposited to form contacts 406' and support 408 are still wet, or the adhesives forming contacts 406' and support 408 may be dried or B-staged prior to attachment of electronic device 410' thereto. Where a thermoplastic adhesive is utilized for contacts 406' and support 408, electronic device 410' may be attached to substrate 402 by heating substrate 402 and/or electronic device 410' to an elevated temperature sufficient to melt flow the thermoplastic adhesive (i.e. make it wettable for bonding and curing) when substrate 402 and device 410' are pressed together. Where a thermosetting adhesive is utilized for contacts 406' and support 408, electronic device 410' may be attached to substrate 402 by pressing device 410' into the wet thermosetting adhesive or by heating substrate 402 and/or electronic device 410' to an elevated temperature sufficient to melt flow the B-staged thermosetting adhesive (i.e. make it wettable for bonding and curing) and pressing substrate 402 and device 410' together. The thermosetting adhesive may then be cured by heating for a sufficient time at an appropriate elevated temperature.

The preferred adhesive for card 400, 400' is a type PSS8150 electrically-conductive, flexible thermosetting adhesive also available from AI Technology, which may be printed with a suitable width and thickness, e.g., about 1 mm wide and 0.1 mm thick, to provide suitable conductivity and quality factor Q of antenna 404'. An underfill may be employed to better secure electronic device 410' to substrate 402 after it is attached thereto by contacts 406' and support 408'. Where electronic device 410' is of small size, e.g., less than about 5 mm along its edge, an underfill of rigid material or of flexible material may be employed, with a flexible underfill material being employed where substrate 402 is flexible. If device 410' is larger, however, than about 5 mm along any edge and a rigid substrate such as an FR4 substrate is employed, or if substrate 402 is flexible, or if the adhesive employed for contacts 406' and/or support 408 is a flexible adhesive, then a flexible adhesive underfill is preferred. The underfill adhesive provides additional strength for the bond between device 410' and substrate 402, and also provides additional insulation and resistance to intrusion of contaminants, including migration of silver from the conductive particles that might be employed to impart conductivity to an electrically-conductive adhesive. The preferred adhesive for flexible underfill is a type MEE7650-5 electrically-insulating, flexible thermosetting adhesive also available from AI Technology, which may be applied along the edges of electronic device 410' and is drawn between device 410' and substrate 402 by capillary action. In addition, the same flexible insulating adhesive material may be employed as a protective coating for substrate 402 and card 400, 400' to resist mechanical abrasion of RF loop antenna 404' and contact of contaminants and other environments therewith Because the size of the electronic devices usually utilized in these types of cards, rigid adhesive underfill may be utilized if additional mechanical protection is desired.

The method for making an exemplary card 400' is as follows. A 7-mil thick (0.178 mm) sheet of annealed, highly-printable PVC is obtained. Preferably, the sheet is of sufficient size that a plurality of substrates 402 may be made contemporaneously. For example, an 11-inch by 11-inch (about 28 mm by 28 mm) sheet is convenient for making a panel containing a 3 by 4 array of 12 substrates, or an 11-inch by 18-inch (about 28 mm by 46 mm) sheet is convenient for making a panel containing a 3 by 8 array of 24 substrates, each with sufficient unused peripheral area of the sheet remaining for the placement of guide holes or other indexing and alignment indicia that facilitate placement and alignment of the sheet, for example, with respect to screens and stencils, pick-and-place equipment, laminating equipment, die-cutting equipment, and the like. An electrically-conductive adhesive, such as type PSS8090 thermoplastic highly-electrically-conductive (e.g.,<0.001 ohm-cm conductivity) adhesive available from AI Technology, is screen printed onto the PVC sheet at a thickness of about 2 mils (about 0.05 mm) to form the conductive loop antennae 404 and contacts 406 to which electronic devices 410 are to be attached in a single step, although stenciling, masking, ink-jet printing or other suitable deposition method could also be utilized. While the conductive adhesive is still wet, electronic devices 410 are heated to a temperature sufficient to melt-flow the conductive adhesive and are placed onto the PVC sheet substrate in the proper positions for contacts thereon to make electrical contact and bond with the conductive adhesive at the ends of the 24 elongated patterns of conductive adhesive loop antennae by pick-and-place equipment. The substrates 402 with electronic devices 410 thereon are then dried or B-staged in an oven at about 60° C., and may be inspected and electrically tested, if desired. A 10-mil thick (0.25 mm) sheet 424 of dried type MB7060-W melt-flowable white-pigmented adhesive is laminated to another sheet of 7-mil thick (0.178 mm) annealed highly-printable PVC at a temperature of about 75° C. Preferably, this PVC sheet is of like size to that of which the plurality of substrates 402 are made, i.e. an 11-inch by 18-inch (about 28 mm by 46 mm) sheet for making a 3 by 8 array of 24 card blanks 420' with sufficient unused peripheral area of the sheet remaining for the placement of guide holes or other indexing and alignment indicia corresponding to those on the sheet of substrates 402 that facilitate placement and alignment of these two sheets. With proper indexing and sufficient precision of size, individual panels can be laminated to a web form for ease of subsequent die cutting and further processing. The sheet of substrates 402 and the sheet of card blanks 420' are roll laminated together at a temperature and speed selected to raise the adhesive 424 to about 65–75° C., which may be facilitated by pre-heating the two sheets to about 50–60° C. and also by employing heated pinch rollers spaced apart by a distance equal to the thickness of the finished card 400'. The pinch rollers also tend to eliminate trapping of air in pockets between the substrate, the card blank, and the adhesive, which would tend to weaken the card. The combined sheet of laminated cards 400' are then cut by a suitable rotary die cutter into individual cards, e.g., 24 cards, 400' each having an electronic device 410 embedded therein.

In like manner, cards 400, 400' of PET and other materials may be made by the foregoing method where PET sheets and suitable melt-flowable adhesives, such as types MB7100 from AI Technology, and temperatures consistent therewith, are employed therein. For example, for substrates of PET material, electronic devices 410 may be attached with conductive adhesives at a melt-flow temperature of either 120° C. or 200° C., such as types PSS8090 and PSS8150, respectively, as is convenient, because with the PET heated to about 120° C. and the electronic device heated to about 200° C., the adhesive will melt flow and bond instantly without heating the PET appreciably above 120° C. Lamination of the card thereafter requires a temperature in the range of about 60–120° C., and preferably about 80° C., depending on the particular melt-flowable adhesive employed, which does not disturb the connections attaching the electronic device embedded therein. If an optional adhesive underfill is desired between electronic device 410 and substrate 402, a flexible adhesive, such as types MEE7650, MEE7650-5 and MEE7850 thermosetting epoxy adhesives available from AI Technology, which cure at a temperature of less than about 80° C., is suitable. Where the size of the electronic device is small, conventional rigid adhesive underfill may be employed.

It is noted that the arrangement of FIG. 14 is particularly advantageous because no cavity is required to be machined or otherwise formed in the card blank to receive the electronic device therein. This not only saves time and reduces cost, but also simplifies processing, and in addition permits thin substrate 402 and card blank 420' materials, e.g., each about 5 mils (about 0.127 mm) thick, to be employed with a relatively thicker adhesive layer 424, e.g., about 10–15 mils (about 0.25–0.38 mm) thick, to easily accommodate standard thickness electronic devices. Thus, the melt flowable adhesive layer, such as type MB7070 thermoplastic adhesive which flows at a low temperature of about 70–90° C., serves as the core of card 400' and flows around electronic device 410 to "form in place" the cavity therefor with precise size and location. As a result, there is no need for an underfill of insulating adhesive under electronic device 410, thereby avoiding additional processing.

Figure 17:
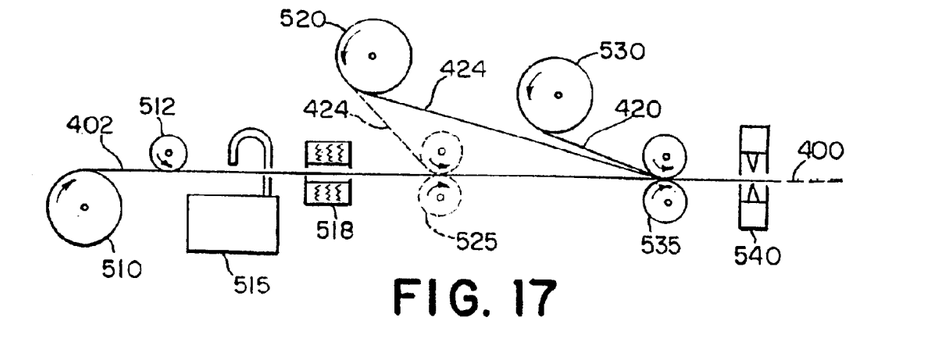
FIG. 17 is a manufacturing arrangement useful with the foregoing electronic substrates and cards.

In fact, the foregoing method advantageously lends itself to being employed in a continuous process to produce a large number of cards having an electronic device embedded therein. As shown in FIG. 17, instead of being provided in sheet form, the material from which substrates 402 and card blanks 420, 420' are made is provided as long strips in roll form, i.e. on rolls 510 and 530, respectively, as is the melt-flowable adhesive on roll 520 to be laminated therewith. The conductive loops 404 and contacts 406 are roll printed onto the moving substrate strip 402 at printing station 512, the electronic devices 410 are placed thereon as substrate strip 404 moves past a pick-and-place equipment station 515, and the moving strip is dried as it passes through a drying oven station 518. Then the prepared substrate strip 402, the melt-flowable adhesive strip 424 and the card blank strip 420 are brought together, preferably after pre-heating, and roll laminated in a set of pinch rollers 535 heated to a suitable elevated temperature and spaced apart a fixed distance that is the final card thickness, to form a strip of completed cards. Alternatively, panels having suitable sprocket holes may be butted together end-to-end and driven by a sprocket drive so as to be driven together with strips of adhesives. Finally the individual cards 400 are cut from the strip by a suitable rotary die cutter or other cutter 540.

Further, the arrangement of FIG. 17 may be employed with a roll 510 providing a strip 220 of electronic substrates 224 onto which electronic devices 212 are attached at station 515, and which is laminated with a strip of adhesive 206 by heated pinch rollers 225 to form a strip of individual electronic modules 210 of the sort shown in FIG. 5.

By way of comparison to illustrate one advantage of cards according to the present invention, the cost of materials and assembly for conventional PVC smart cards, excluding the cost of the electronic device, is estimated to be in the range of about $0.25–$0.50 for a contact type smart card, however, conventional contact-less smart cards are even more costly owing to the addition of a wire-loop antenna. On the other hand, the cost of materials and assembly, but excluding the electronic device, for a contact-less card having an embedded electronic device, and utilizing the higher temperature, higher-cost PET material, as described above in relation to FIGS. 11, 12 and 14, is estimated to be about $0.15–$0.25 when made in panels of 40 cards each (e.g., about 50 mm by 50 mm panels), and thus not benefitting from the lower cost associated with a continuous type process.

It is noted that other articles may be made by the methods described herein. For example, the wireless articles described in U.S. patent application Ser. No. 09/411,849 entitled "Wireless Article Including A Plural-Turn Antenna" filed by Kevin K-T Chung on Oct. 4, 1999, now U.S. Pat. No. 6,353,420, which application is incorporated in co-pending parent application Ser. No. 09/412,058 and herein by reference it its entirety, may be so made.

Suitable pick-and-place equipment that is employed in the method described herein and in conventional surface mount technology is widely available commercially and typically has a placement inaccuracy of 0.12 mm or less. Suitable pick-and-place equipment is commercially available from Mydata Automation located in Peabody, Mass., from Universal Instrument located in Binghamton, N.Y., from Zevatech Inc. located in Morrisville, N.C., and from Manncorp, and can place objects onto substrates with a positional inaccuracy of one one-thousandth of an inch or less and at a rate greater than one object per second.

As is known, the contact pads on the substrates and those on the electronic devices are preferably passivated with an oxidation-resistant conductive material to further their making low resistance and reliable electrical connections. For example, copper contacts may be tinned with solder or plated, as are aluminum and other semiconductor contacts, or otherwise coated with layers of nickel, gold, nickel-gold, palladium, nickel-palladium, platinum or other precious metal, and combinations and alloys thereof.

While the present invention has been described in terms of the foregoing exemplary embodiments, variations within the scope and spirit of the present invention as defined by the claims following will be apparent to those skilled in the art. For example, while the electronic devices are described as being attached to substrates by solder or adhesive interconnections alone, suitable adhesive underfill materials may be employed to fill the thin space between the electronic device and the substrate. Where the interconnections are formed by a flexible conductive adhesive, for example, a suitable underfill is a flexible insulating adhesive having a modulus of elasticity that is no greater than that of the flexible conductive adhesive. Adhesive underfill may be applied in the form of a preform or by screening, stenciling, masking, ink-jet printing or other suitable method. Where the size of an electronic device is less than about 5 mm along any edge, conventional rigid adhesive underfill may be employed.

In addition, although the electronic devices herein have been described as semiconductor devices, of which semiconductor integrated circuits, memories, microprocessors and the like are most likely employed, electronic devices could include networks of conductors and/or diodes for providing continuity and the lack thereof between particular contacts, networks of resistors and/or capacitors and/or inductors, as may be necessary or convenient in any particular application of a card according to the present invention.

Further, contact-less cards may be made as described herein employing etched metal or wire conductive loops on the card substrate to serve as the RF antenna therefor. While not as advantageous as certain embodiments described herein, wire loops may facilitate multiple turn antennae having higher gain. However, it is noted that loop antennae having a small number of turns may be employed in cards according to the present invention wherein the electronic device has spaced apart contacts that connect to the ends of the multi-turn loop antenna and the electronic device is mounted to bridge over or straddle the intermediate turns of the antenna.

In any case, the antenna contacts to which the electronic devices employed therewith electrically connect may be deposited onto the substrate to make contact to the loop antenna thereon or may be deposited onto the electronic devices, either at the individual semiconductor chip level or at the semiconductor wafer level, to make contact with the loop antenna when the electronic device is attached to the substrate.

In addition to the smart-card type credit card applications, cards and other articles having electronic devices embedded therein according to the present invention may be utilized in other applications and in special environments, such as remotely identifiable tagging devices used to keep track of, identify, and/or account for personnel, animals, tools, equipment, laundry, and other items. In certain of these applications, the cards and the electronic devices therein may be exposed to a totally different environment that requires the substrate to be of a material other than those described above in relation to typical credit card applications. For example, in the case of laundry tags, the card and embedded device is washed and cleaned along with the clothing or other article to which it is attached and so is exposed to various chemical solvents, soaps, detergents and water, as well as to high temperatures of up to about 250° C. In such applications, the substrate and card blank must be able to withstand the higher temperature and the chemical environment, and so may be formed of polyimide film, such as Kapton® film, or other high temperature thermoplastics and thermoset materials. Further, to protect the electronic device, the attached semiconductor die may be encapsulated with a resin that exhibits satisfactory resistance to the expected chemicals and solvents to which the card will be exposed, such as type MEE7650. Different layering and thicknesses of adhesives may also be utilized. For example, types ESP7450-SC or TP7205-E pressure sensitive adhesives may be pre-applied as an outer layer of an article and may subsequently be utilized to bond the article onto the object that the article is to identify. The foregoing adhesives are also commercially available from AI Technology.

What is claimed is:

1. A method for making an article having an electronic device embedded therein comprising:

providing a substrate having first and second opposing broad planar surfaces;

forming an elongated electrical conductor on the first broad planar surface of the substrate;

attaching an electronic device to the first broad planar surface of the substrate;

providing a layer of melt-flowable adhesive proximate the first broad planar surface of the substrate, wherein the layer of melt-flowable adhesive has a thickness that is substantially uniform and sufficient to cover the electronic device; and melt flowing the melt-flowable adhesive to the first broad planar surface of the substrate to encapsulate the electronic device thereto in the substantially uniform thickness layer of melt-flowable adhesive;

wherein said forming an elongated electrical conductor includes depositing a loop antenna pattern of a conductive adhesive on the first broad planar surface of the substrate, and wherein said attaching an electrical device includes attaching at least one contact on the electronic device to one contact of the loop antenna pattern of conductive adhesive.

2. A method for making an article having an electronic device embedded therein comprising:

providing a substrate having first and second opposing broad planar surfaces;

attaching an electronic device to the first broad planar surface of the substrate;

providing a layer of melt-flowable adhesive proximate the first broad planar surface of the substrate, wherein the layer of melt-flowable adhesive has a thickness that is substantially uniform and sufficient to cover the electronic device; and melt flowing the melt-flowable adhesive to the first broad planar surface of the substrate to encapsulate the electronic device thereto in the substantially uniform thickness layer of melt-flowable adhesive, wherein said melt flowing includes heating the melt-flowable adhesive to a melt-flow temperature, which melt-flow temperature is less than a deformation temperature of the substrate and the card blank.

3. The method of claim 1 or 2 wherein said attaching an electronic device includes forming electrical connections between contact pads on the substrate and corresponding contact pads on the electronic device.

4. The method of claim 3 wherein said forming electrical connections includes at least one of forming a solder connection, forming a conductive adhesive connection and forming a flexible conductive adhesive connection.

5. The method of claim 3 wherein said forming electrical connections includes depositing a pattern of electrically conductive adhesive contact features corresponding to the pattern of contact pads of the electronic device onto the first broad planar surface of the substrate.

6. The method of claim 5 wherein said attaching an electronic device includes placing the contact pads of the electronic device against the corresponding contact features at a time when the conductive adhesive thereof is wet.

7. The method of claim 5 wherein said attaching an electronic device includes placing the contact pads of the electronic device against the corresponding contact features at a time after the conductive adhesive thereof is one of dried and B-staged.

8. The method of claim 1 or 2 wherein said providing a layer of melt-flowable adhesive includes forming the layer of melt-flowable adhesive on the first broad planar surface of the substrate after the electronic device is attached thereto.

9. The method of claim 8 wherein said forming the layer of melt-flowable adhesive includes one of sheet laminating, roll coating, screen printing, stenciling, masking, and ink-jet printing the melt-flowable adhesive.

10. The method of claim 2 further comprising forming an elongated electrical conductor on the first broad planar surface of the substrate.

11. The method of claim 10 wherein said forming an elongated electrical conductor includes depositing a pattern of a conductive adhesive on the first broad planar surface of the substrate.

12. The method of claim 11 wherein said attaching an electrical device includes attaching at least one contact on the electronic device to a location on the pattern of conductive adhesive.

13. The method of claim 1 or 2 wherein said melt flowing the melt-flowable adhesive comprises:
   placing a card blank against the layer of melt-flowable adhesive; and
   melt flowing the melt-flowable adhesive to attach the card blank to the substrate with the electronic device therebetween.

14. The method of claim 13 wherein said placing a card blank includes positioning a card blank having a cavity adapted for receiving an electronic device therein in a position with the cavity opposite the electronic device.

15. The method of claim 14 wherein said melt flowing includes pressing the substrate and the card blank together to position the electronic device in the cavity in the card blank.

16. The method of claim 1 or 2 wherein providing a substrate includes providing one of a strip and a panel of a plurality of substrates.

17. The method of claim 16 including separating the one of a strip and a panel of a plurality of substrates into a plurality of separate substrates after said melt flowing the melt-flowable adhesive.

18. A method for making an article having an electronic device embedded therein comprising:
   providing a substrate having first and second opposing broad planar surfaces comprising one of a strip and a panel of a plurality of substrates;
   attaching an electronic device to the first broad planar surface of the substrate;
   providing a layer of melt-flowable adhesive proximate the first broad planar surface of the substrate, wherein the layer of melt-flowable adhesive has a thickness that is substantially uniform and sufficient to cover the electronic device; and
   melt flowing the melt-flowable adhesive to the first broad planar surface of the substrate to encapsulate the electronic device thereto in the substantially uniform thickness layer of melt-flowable adhesive;
   wherein said providing a layer of melt-flowable adhesive includes forming the layer of melt-flowable adhesive on the first broad planar surface of the provided one of a strip and a panel of substrates after the electronic device is attached thereto, and further including separating the provided one of a strip and a panel of a plurality of substrates into a plurality of separate substrates after said forming the layer of melt-flowable adhesive on the first broad planar surface thereof.

19. A method for making a plurality of articles each having an electronic device embedded therein comprising:
   providing substrate material having first and second opposing broad planar surfaces, wherein the substrate material has a plurality of contact patterns on the first broad planar surface thereof;
   attaching an electronic device having contacts to each of the plurality of contact patterns on the first broad planar surface of the substrate material;
   providing a layer of melt-flowable adhesive proximate the first broad planar surface of the substrate material, wherein the layer of melt-flowable adhesive has a thickness that is substantially uniform and is sufficient to cover the plurality of electronic devices;
   melt flowing the layer of melt-flowable adhesive to the first broad planar surface of the substrate material to encapsulate the electronic device thereto in the substantially uniform thickness layer of melt-flowable adhesive; and
   after said melt flowing the melt-flowable adhesive, separating the broad planar substrate material into a plurality of separate articles wherein each separate article includes at least one of the plurality of electronic devices encapsulated to a substrate by a portion of the melt-flowed layer of melt-flowable adhesive.

20. The method of claim 19 further comprising:
   placing plastic blank material opposing the layer of melt-flowable adhesive and the first surface of the broad planar substrate material with the electronic device between the substrate material and the plastic blank material; and wherein said melting the melt-flowable adhesive comprises:
   attaching the plastic blank material and the broad planar substrate material with the layer of melt-flowable adhesive substantially filling the space therebetween to substantially encapsulate the electronic device,
   wherein each separate article incldes at least one of the plurality of electronic devices encasulated on a substrate and a portion of the plastic blank material.

21. The method of claim 19 wherein said attaching an electronic device includes, for each electronic device, at least one of:
   making electrical connections of the contacts of the electronic device to a loop antenna disposed on either the first or the second broad planar surface of the substrate material via one of the plurality of contact patterns on the first broad planar surface of the substrate material; and
   making electrical connections of the contacts of the electronic device to a pattern of external contacts on the second broad planar surface of the substrate material via one of the plurality of contact patterns on the first broad planar surface of the substrate material.

22. The method of claim 21 wherein said making electrical connections includes at least one of forming a solder connection, forming a conductive adhesive connection and forming a flexible conductive adhesive connection.

23. The method of claim 19 wherein said providing a layer of melt-flowable adhesive includes one of sheet laminating, roll coating, screen printing, stenciling, masking, and ink-jet printing the melt-flowable adhesive on the first broad planar surface of the substrate material.

\* \* \* \* \*